United States Patent [19]

Akita

[11] Patent Number: 6,140,851
[45] Date of Patent: Oct. 31, 2000

[54] PLL SYNTHESIZER HAVING A VOLTAGE CONTROLLED OSCILLATOR WITH TUNING OFFSET AND OUTPUT TUNING CONTROLLED

[75] Inventor: Hiroyuki Akita, Tokyo, Japan

[73] Assignee: Oki Electric Industry Co., Ltd., Tokyo, Japan

[21] Appl. No.: 09/161,737

[22] Filed: Sep. 29, 1998

[30] Foreign Application Priority Data

Oct. 2, 1997 [JP] Japan ..................................... 9-269821

[51] Int. Cl.[7] ...................................................... H03L 7/06
[52] U.S. Cl. ............................ 327/156; 327/105; 331/16; 331/17
[58] Field of Search .................................... 327/105, 106, 327/156, 158, 159; 331/16, 17, 25

[56] References Cited

U.S. PATENT DOCUMENTS

| | | | |
|---|---|---|---|
| 5,140,286 | 8/1992 | Black et al. ................................ | 331/99 |
| 5,559,474 | 9/1996 | Matsumoto et al. ...................... | 327/157 |
| 5,574,407 | 11/1996 | Sauer et al. ............................... | 327/159 |

FOREIGN PATENT DOCUMENTS

WO95/02282  1/1995  WIPO .

*Primary Examiner*—Kenneth B. Wells
*Attorney, Agent, or Firm*—Venable; Robert J. Frank; Michael A. Sartori

[57] ABSTRACT

A PLL (Phase-Locked Loop) synthesizer includes a VCO (Voltage Controlled Oscillator) having an oscillating section and an outputting section. The oscillating section selectively oscillates with a frequency of f2 or f3 in accordance with a control voltage applied to its turning offset control terminal. The outputting section tunes to the frequency f2 or a frequency of 2×f3 in accordance with a control voltage applied to its tuning control terminal, and produces an output signal. A variable frequency divider divides a part of the output signal fed thereto with a preselected ratio and delivers its output to a phase comparator. The phase comparator produces a phase error signal representative of a phase difference between the output of the phase comparator and a reference signal. An LPF (Low Pass Filter) filters out high frequency components contained in the phase error signal and delivers its output to a PLL control voltage terminal included in the oscillating section. The oscillating section varies its oscillation frequency in accordance with the output of the LPF such that the phase error signal converges to zero.

5 Claims, 3 Drawing Sheets

PLL SYNTHESIZER HAVING A VOLTAGE CONTROLLED OSCILLATOR WITH TUNING OFFSET AND OUTPUT TUNING CONTROLLED

BACKGROUND OF THE INVENTION

1. Field of the Invention

The present invention relates to a PLL (Phase-Locked Loop) synthesizer and, more particularly, to a PLL synthesizer capable of outputting signals lying in two or more different frequency bands.

2. Description of the Background Art

It is a common practice with a portable telephone to effect communication by using two different frequency bands, i.e., a 800 MHz to 900 MHz band and a 1.5 GHz or 1.9 GHz band. In the market, however, there is an increasing demand for a portable telephone capable of covering two different frequency bands, e.g., 800 MHz band and 1.5 GHz band alone. To meet this demand, a PLL synthesizer included in a portable telephone either for local oscillation or for modulation is required to cover the two different frequency bands.

However, because the above two frequency bands are remote from each other, it is difficult for the PLL synthesizer to cover both of the two frequency bands with a single VCO (Voltage Controlled Oscillator) from the stable frequency security standpoint. In light of this, the PLL synthesizer may be provided with two VCOs each oscillating a signal lying in a particular frequency band, and a switch for selecting either one of the signals output from the VCOs. However, the provision of the PLL with the two VCOs and the switch scales up the circuitry of the PLL synthesizer to thereby increase the overall size and cost of a portable telephone set including the synthesizer.

SUMMARY OF THE INVENTION

It is therefore an object of the present invention to provide a PLL synthesizer capable of covering two remote frequency bands with a single VCO.

In accordance with the present invention, a PLL synthesizer includes a VCO including an oscillating section capable of selectively outputting signals respectively lying in at least two different frequency bands by switching the connection of its circuit elements, and an outputting section capable of selectively tuning to signals respectively lying in at least two different frequency bands by switching the connection its circuit elements. A frequency divider divides with a preselected frequency division ratio any one of the signals to which said outputting section is tuned. A phase comparator compares the phase of a signal output from the frequency divider and the phase of a reference signal to thereby output a phase error. The oscillating section varies, in response to the phase error output from the phase comparator, its oscillation frequency such that the phase error converges to zero.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENT

Figure 1:
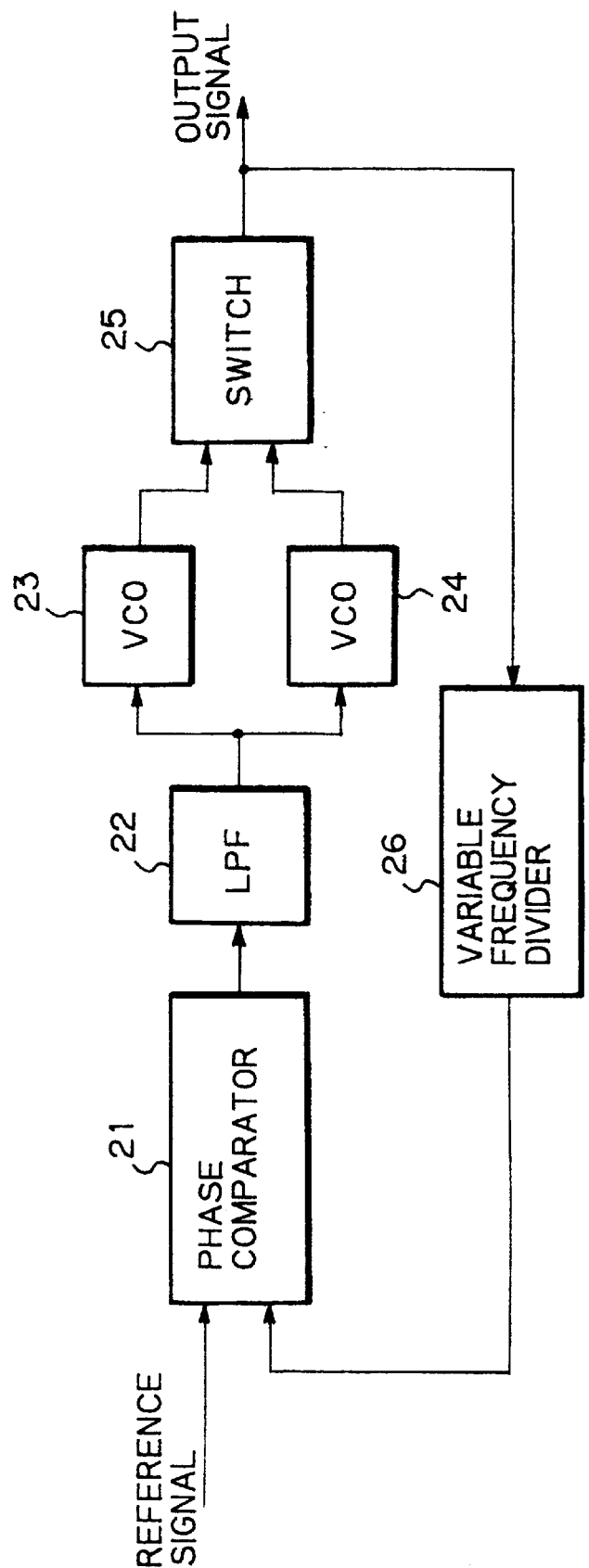
FIG. 1 is a block diagram schematically showing a conventional PLL synthesizer.

To better understand the present invention, brief reference will be made to a conventional PLL synthesizer, shown in FIG. 1. As shown, the PLL synthesizer includes a phase comparator 21, a low pass filter (LPF), two VCOs 23 and 24, a switch 25, and a variable frequency divider. Each of the VCOs 23 and 24 outputs a signal lying in a particular frequency band. The switch 25 selects either one of the signals output from the VCOs 23 and 24. With this configuration, the synthesizer is capable of outputting one of the two VCO outputs corresponding to a frequency band to be used. However, such a conventional PLL has a problem that the provision of the synthesizer with the two VCOs 23 and 24 and the switch 25 scale up the synthesizer circuitry to thereby increase the overall size and cost of a portable telephone set including the synthesizer.

Figure 2:
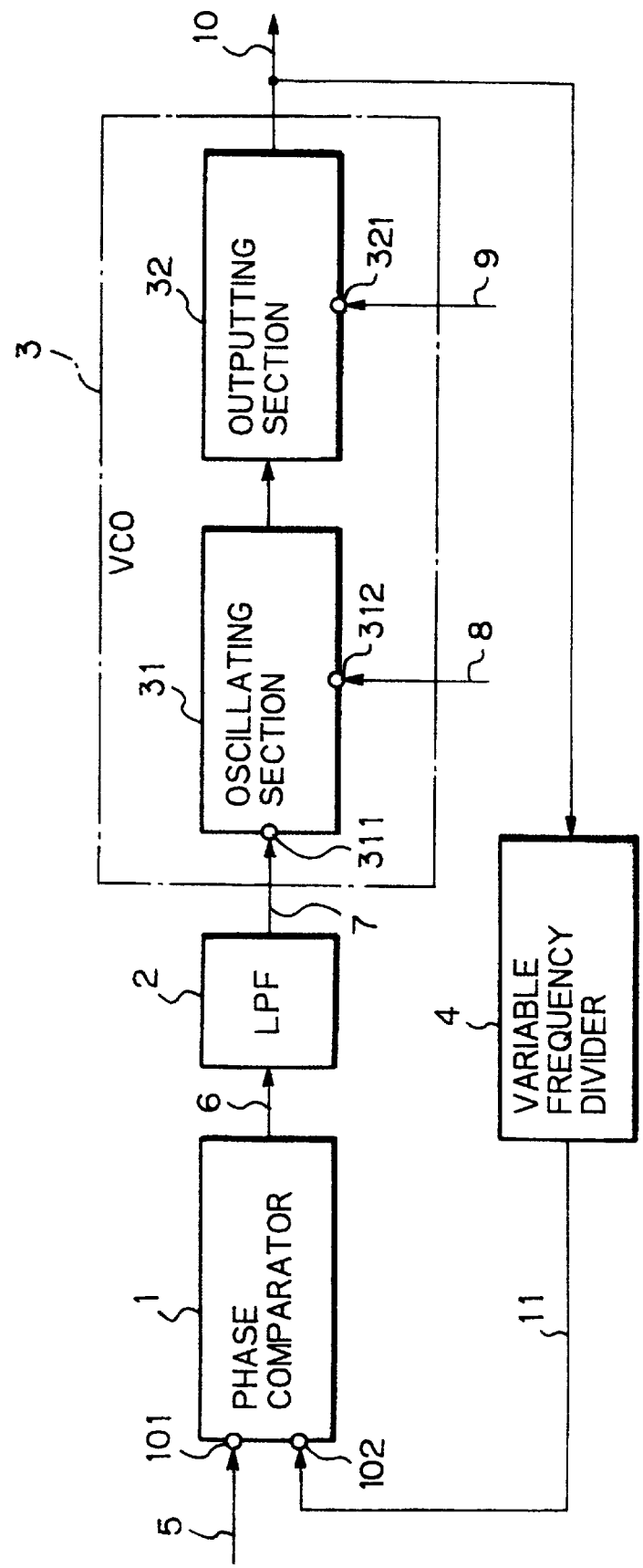
FIG. 2 is a block diagram schematically showing a PLL synthesizer embodying the present invention.

Referring to FIG. 2 of the drawings, a PLL synthesizer embodying the present invention is shown. Briefly, by using harmonics contained in the output of a VCO, the illustrative embodiment generates signals respectively lying in two frequency bands remote from each other with a single VCO.

As shown in FIG. 2, the PLL synthesizer includes a phase comparator 1 having a first and a second input terminal 101 and 102. A reference signal 5 is applied to the first input terminal 101 from the outside of the synthesizer. A variable frequency divider 4 feeds its output 11 to the second input terminal 102. The phase comparator 1 compares the reference signal 5 and signal 11 in order to detect a phase difference. A phase error signal 6 representative of the detected phase difference is delivered from the phase comparator 1 to an LPF 2. The LPF 2 removes needless high frequency components from the phase error signal 6 and feeds the resulting phase error signal 7 to a VCO 3.

The VCO 3 is made up of an oscillating section 31 for generating signals respectively lying in two different frequency bands, and an outputting section 32 for selectively outputting a fundamental wave or a preselected harmonic. The oscillating section 31 includes a PLL control voltage terminal 311 to which the phase error signal 7 is input from the LPF 2, and a tuning offset control terminal 312 to which a control voltage 8 is applied from the outside of the synthesizer. The oscillating section 31 sets an oscillation frequency in response to the control voltage 8 and varies the oscillation frequency in accordance with the phase error signal 7. The outputting section 32 includes a tuning circuit, not shown, and a tuning control terminal 321 to which a control voltage 9 is applied from the outside of the synthesizer. The outputting section 32 tunes, based on the control voltage 9, the tuning circuit to the fundamental wave or the preselected harmonic output from the oscillating section 31. The fundamental wave or the preselected harmonic is fed from the outputting section 32 to the outside as an output signal 10 while being partly applied to the variable frequency divider 4.

Figure 3:
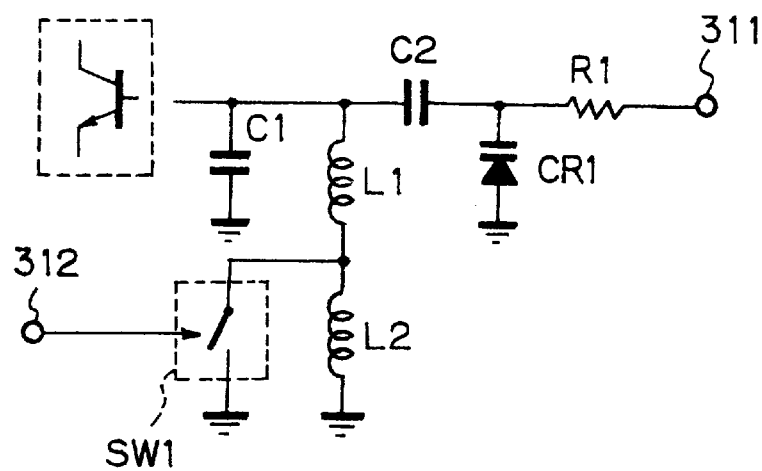
FIG. 3 is a circuit diagram showing a specific configuration of a tuning circuit included in an oscillating section shown in FIG. 2.

FIG. 3 shows a specific configuration of a tuning circuit included in the oscillating section 31 for determining the oscillation frequency of the oscillating section 31. As shown, the tuning circuit includes a serial connection of inductances L1 and L2 and a capacitor C1 and a variable capacity diode CR1 which are connected in parallel with the above serial connection. A switch SW1 is connected to both ends of the inductance L2. The variable capacity diode CR1 is connected to the PLL control voltage terminal 311 via a resistor R1. The switch SW1 closes only when the control voltage 8 is applied to the tuning offset control terminal 312, short-circuiting the opposite ends of the inductance L2 with respect to AC. The variable capacity diode CR1 varies its capacity in accordance with the phase error signal 7 input to the PLL control voltage terminal 311.

In the configuration shown in FIG. 3, the opposite ends of the inductance L2 are selectively short-circuited by the switch SW1. As a result, the oscillating section 31 including such a tuning circuit selectively oscillates in two preselected frequency bands different from each other. Assume that the inductances L1 and L2 have values l1 and l2, respectively, and that the capacity of the capacitor C1 and the capacity of the variable capacity diode CR1 are c1 and c2, respectively. Then, the oscillating section 31 oscillates with a frequency of f01 when the inductance L2 is short-circuited or with a frequency of f02 when it is not short-circuited. The frequencies f01 and f02 are expressed as:

$$f01 = 1/[2\pi\{l1(c1+c2)\}^{1/2}]$$

$$f02 = 1/[2\pi\{(l1+l2)(c1+c2)\}^{1/2}]$$

Figure 4:
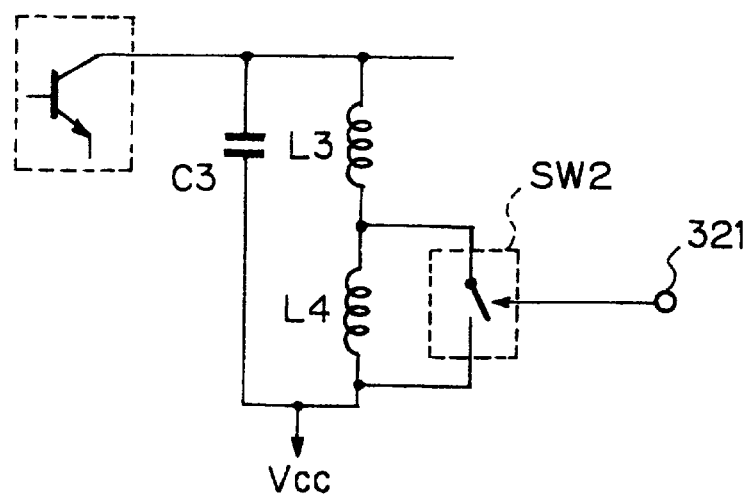
FIG. 4 is a circuit diagram showing a specific configuration of a tuning circuit included in an outputting section also shown in FIG. 2.

A specific configuration of the tuning circuit included in the outputting section 32 will be described with reference to FIG. 4. This tuning circuit, connected to the output side of the outputting section 32, tunes to the fundamental wave or the preselected harmonic appearing on the output of the oscillating section 31, thereby outputting the fundamental wave or the harmonic. As shown in FIG. 4, the tuning circuit includes a serial connection of inductances L3 and L4. A capacitor C3 is connected in parallel with the inductances L3 and L4. A switch SW2 is connected to the opposite ends of the inductance L4. The switch SW2 closes only when the control voltage 9 is applied to the tuning control terminal 321, short-circuiting the opposite ends of the inductance L4 with respect to AC. The tuning circuit can therefore tune the outputting section 32 to either one of two preselected different frequency bands in accordance with the position of the switch SW2 short-circuiting or not short-circuiting the opposite ends of the inductance L4.

Each of the tuning circuits shown in FIGS. 3 and 4 is assumed to tune the oscillating section 31 or the outputting section 32 to two different frequencies. Alternatively, the inductance whose opposite ends are connected to the switch may be serially connected to the inductance L2 or L4 in order to selectively tune the section 31 or 32 to three different frequencies.

The variable frequency divider 4 shown in FIG. 2 divides the frequency of the signal input thereto from the outputting section 32 of the VCO 3, and delivers its output 11 to the input terminal 102 of the phase comparator 1. The frequency division ratio of the frequency divider 4 is set beforehand by a control signal fed from the outside of the synthesizer such that the output signal 10 has a desired frequency. In the illustrative embodiment, the frequency division ratio is determined in terms of a ratio between the frequency of the reference signal 5 and that of the output signal 10.

The frequencies of signals appearing in the illustrative embodiment will be described hereinafter. Assume that the frequency of the reference signal 5 input to the phase comparator 1 is f1, that the oscillation frequency of the oscillating section 31 is f2, and that the output signal 10 has a frequency f3. Further, assume that the frequency division ratio of the variable frequency divider 4 is 1/N, and that the harmonic selected by the outputting section 32 has a degree of M (fundamental wave if M×1). Then, there holds the following relation between the frequencies f1, f2 and f3:

$$f3 = N \times f1 = M \times f2$$

For example, assume that the PLL synthesizer covers a frequency band of 800 MHz and a frequency band of 1.5 GHz, and that the tuning circuits of the oscillating section 31 and outputting section 32 have the specific configurations shown in FIGS. 3 and 4, respectively. The values of the circuit elements of the tuning circuit in the outputting section 32 are selected such that the section 32 is capable of tuning to the 800 MHz band and 1.5 GHz band by switching the connection of its circuit elements. The oscillation frequency of the oscillating section 31 is determined on the assumption that the outputting section 32 selects the fundamental wave and the second degree harmonic for the 800 MHz band and 1.5 GHz band, respectively. Specifically, the values of the circuit elements of the tuning circuit in the oscillation section 31 are selected such that the section 31 is capable of oscillating in the 800 MHz band and 750 MHz band by switching the connection of its circuit elements.

In the above construction, the oscillating section 31 selectively oscillates in the 800 MHz band or the 750 MHz band while the outputting section 32 selectively outputs a signal lying in the 800 MHz band or a signal lying in the 1.5 GHz band. In this manner, the oscillating section 31 should only output signals lying in the 800 MHz band and 750 MHz band relatively close to each other. This allows a single VCO to output signals of two different frequencies stably. Assume that the PLL synthesizer covers a frequency band of 800 MHz and a frequency band of 1.9 GHz. Then, the outputting section 32 will also be constructed to select the fundamental wave for the 800 MHz band or the second degree harmonic for the 1.9 GHz band, so that the oscillating section 31 should only output signals lying in the 800 MHz band and 950 Hz band relatively close to each other.

In operation, assume that the oscillating section 31 is set so as to oscillate at the frequency f2, and that the tuning circuit of the outputting section 32 is so set as to tune the section 32 to the frequency f3 (=2×f2). Then, although the oscillating section 31 oscillates with the frequency f2, many harmonics of high degree appear on the output side of the section 31 together with the fundamental wave having the frequency f2. As a result, a second degree harmonic having the frequency f3 appears in the tuning circuit of the outputting section 32 with a higher level than the fundamental wave and the other harmonics. The second degree harmonic is delivered to the outside of the synthesizer as the signal 10 and partly applied to the variable frequency divider 4.

The signal 10 input from the outputting section to the variable frequency divider 4 has its frequency divided by N and turns out the signal 11 having a frequency of f1/N. This signal 11 is input to the terminal 102 of the phase comparator 1. The frequency division ratio 1/N of the frequency divider 4 is so selected as to satisfy a relation:

$$1/N = 1/(f3 \div f1)$$

where f3 denotes the desired frequency of the output signal 10, and f1 denotes the frequency of the reference signal 5.

The phase comparator 1 compares the phase of the reference signal 5 and that of the signal 11. If the phase of the reference signal 5 and that of the signal 11 are coincident, i.e., if the frequency of the output signal 10 is coincident with the desired frequency f3, then the comparator 1 makes its output zero. If the phase of the reference signal and that of the signal 11 are not coincident, i.e., if the frequency of the output signal 10 is deviated from the desired frequency f3, then the comparator 1 outputs the phase error signal 6 having a positive or a negative amplitude proportional to the deviation.

The phase error signal 6 output from the phase comparator 1 is input to the LPF 2. The LPF 2 filters out needless high frequency components and feeds the filtered signal to the VCO 3 as a phase error signal 7. The phase error signal 7 is routed through the PLL control voltage terminal 311 of the oscillating section 31 and the resistor R1, FIG. 3, to the variable capacity diode CR1, FIG. 3. As a result, the capacity of the diode CR1 increases or decreases in accordance with the amplitude and polarity of the phase error signal 7, causing the resonance frequency of the tuning circuit and therefore the oscillation frequency to vary. At this instant, the phase error signal 7 is input to the diode CR1 such that the phase error signal 6 output from the phase comparator 1 converges to zero. Consequently, the signal output from the variable frequency divider 4 and the reference signal 5 coincide in phase, i.e., the frequency of the signal 10 output from the VCO 3 coincides with the desired frequency.

As stated above, in the illustrative embodiment, the VCO 3 includes the oscillating circuit 31 capable of selectively oscillating in one of two different frequency bands by switching the connection of its circuit elements, and the outputting circuit 32 capable of selectively tuning to one of the above frequency bands by switching the connection of its circuit elements. Therefore, by switching the oscillation frequency of the oscillating section 31 and the tuning frequency of the outputting section 32, it is possible to reduce the difference between the two frequency bands assigned to the section 31 despite the fact that the output signal needs two different frequency bands. Consequently, two different frequency bands remote from each other are achievable with a single VCO.

The illustrative embodiment has concentrated on a synthesizer for local oscillation and a PLL synthesizer for modulation which are applicable to a portable telephone. The present invention is, of course, applicable to a synthesizer for local oscillation, a PLL synthesizer for modulation, a high frequency circuit or the like included in any other apparatus of the kind dealing with high frequencies.

In summary, in accordance with the present invention, a PLL synthesizer includes a VCO having oscillating means and outputting means. The oscillating means is capable of selectively oscillating in one of two different frequency bands by switching the connection of its circuit elements. The outputting means is capable of selectively tuning itself to one of two different frequency bands by switching the connection of its circuit elements. Therefore, by switching the oscillation frequency of the oscillating means and the tuning frequency of the outputting means, it is possible to reduce the difference between the two frequency bands assigned to the oscillating means despite the fact that a required output signal needs two different frequency bands. This allows a single VCO to implement two different frequency bands remote from each other. For example, while a conventional PLL synthesizer expected to cover two different frequency bands needs two VCOs and a switch for selectively transferring their outputs, the PLL synthesizer of the present invention needs only one VCO and therefore achieves a miniature, low cost configuration.

The entire disclosure of Japanese patent application No. 269821/1997 filed on Oct. 2, 1997 and including the specification, claims, accompanying drawings and abstract of the disclosure is incorporated herein by reference in its entirety.

While the present invention has been described with reference to the illustrative embodiment, it is not to be restricted by the embodiment. It is to be appreciated that those skilled in the art can change or modify the embodiment without departing from the scope and spirit of the present invention.

What is claimed is:

1. A PLL (Phase-Locked Loop) synthesizer comprising:
   a voltage controlled oscillator including an oscillating section for selectively oscillating with frequencies respectively lying in at least two different frequency bands by switching a connection of circuit elements of said oscillating section by a first switch, and an outputting section for tuning to a fundamental wave or a harmonic thereof contained in an output of said oscillating section by switching a connection of circuit elements of said outputting section by a second switch;
   a frequency divider for dividing with a preselected frequency division ratio a frequency of a signal to which said outputting section is tuned; and
   a phase comparator for comparing a phase of a signal output from said frequency divider and a phase of a reference signal to thereby output a control voltage indicative of a phase error;
   said oscillating section varying, in response to the control voltage output from said phase comparator, an oscillation frequency so as to converge said phase error substantially to zero.

2. A PLL synthesizer in accordance with claims 1, wherein said osciallating section selectively oscillates with a first frequency or a second frequency, said outputting section tuning, when said oscillating section oscillates with said first frequency, to a frequency equal to an integral multiple of said first frequency or tuning, when said oscillating section oscillates with said second frequency, to a frequency equal to an integral multiple of said second frequency.

3. A PLL synthesizer in accordance with claim 1, wherein said oscillating section selectively oscillates with a first frequency or a second frequency, said outputting section tuning, when said oscillates section oscillated with said first frequency, to said first frequency or tuning, when said oscillating section oscillates with said second frequency, to a frequency equal to an integral multiple of said second frequency.

4. A PLL (Phase-Locked Loop) synthesizer comprising:
   means for voltage controlled oscillating including means for selectively oscillating with frequencies respectively lying in at least two different frequency bands by switching a first means for switching of said means for selectively oscillating, and means for tuning to a fundamental wave or a harmonic thereof contained in an output of said means for selectively oscillating by switching a second means for switching of said means for tuning;
   means for dividing with a preselected frequency division ratio a frequency of a signal to which said means for tuning is tuned; and
   means for comparing a phase of a signal output from said means for dividing and a phase of a reference signal to thereby output a control voltage indicative of a phase error;
   said means for selectively oscillating varying, in response to the control voltage output from said means for comparing, an oscillation frequency so as to converge said phase error substantially to zero.

5. A PLL (Phase-Locked Loop) synthesizer comprising:

a voltage controlled oscillator comprising an oscillating section and an outputting section, said oscillating section to generate selectively a frequency oscillating signal oscillating in one of at least two different frequency bands, said oscillating section having a first switch receiving a control voltage to switch said oscillating section between said different frequency bands, said outputting section coupled to said oscillating section to tune to a fundamental wave or a harmonic thereof contained in an output from said oscillating section, said outputting section having a second switch to tune said oscillating section;

a frequency divider coupled to said voltage controlled oscillator and to divide with a preselected frequency division ratio a frequency of a signal output by said outputting section; and a phase comparator coupled to said frequency divider and said voltage controlled oscillator, and to compare a phase of a signal output from said frequency divider and a phase of a reference signal to thereby output said control voltage.

* * * * *